US007852159B2

(12) United States Patent
Singh et al.

(10) Patent No.: US 7,852,159 B2
(45) Date of Patent: Dec. 14, 2010

(54) METHOD FOR ADAPTIVE BIASING OF FULLY DIFFERENTIAL GAIN BOOSTED OPERATIONAL AMPLIFIERS

(75) Inventors: Pratap Narayan Singh, Noida (IN); Chandrajit Debnath, Greater Noida (IN)

(73) Assignee: STMicroelectronics Pvt. Ltd., Greater Noida (IN)

( * ) Notice: Subject to any disclaimer, the term of this patent is extended or adjusted under 35 U.S.C. 154(b) by 175 days.

(21) Appl. No.: 12/178,769

(22) Filed: Jul. 24, 2008

(65) Prior Publication Data

US 2009/0027126 A1  Jan. 29, 2009

(30) Foreign Application Priority Data

Jun. 20, 2008  (IN) ............... 1551/DEL/2007

(51) Int. Cl.
*H03F 3/45* (2006.01)
(52) U.S. Cl. ..................... 330/261; 330/253
(58) Field of Classification Search ........... 330/253, 330/258, 260, 261
See application file for complete search history.

(56) References Cited

U.S. PATENT DOCUMENTS

| 5,442,318 | A | 8/1995 | Badyal et al. |
| 5,748,040 | A | 5/1998 | Leung |
| 6,353,361 | B1 * | 3/2002 | Sun ............................ 330/253 |
| 6,362,688 | B1 * | 3/2002 | Au ............................. 330/261 |

OTHER PUBLICATIONS

Bult, et al., "A Fast-Settling CMOS Op Amp for SC Circuits with 90-dB DC Gain," IEEE Journal of Solid-State Circuits, vol. 25, No. 6, Dec. 1990.

* cited by examiner

*Primary Examiner*—Khanh V Nguyen
(74) *Attorney, Agent, or Firm*—Gardere Wynne Sewell LLP

(57) ABSTRACT

An adaptive biasing technique improves fully differential gain boosted operational amplifiers transient characteristics and reduces power consumption. An adaptive biasing module includes a bias generation module and a bias replication module. The bias generation module generates a first control signal (VCMNB) and the first control signal is applied as an output common mode of a differential booster (inside the bias replication module). The bias replication module is coupled to the bias generation module for equalizing a common mode of the differential booster with the first control signal (VCMNB).

14 Claims, 4 Drawing Sheets

METHOD FOR ADAPTIVE BIASING OF FULLY DIFFERENTIAL GAIN BOOSTED OPERATIONAL AMPLIFIERS

PRIORITY CLAIM

The present application claims priority from Indian Patent Application No. 1551/Del/2007 filed Jun. 20, 2008 and Indian Provisional Application No. 1551/Del/2007 filed Jul. 24, 2007, the disclosures of which are hereby incorporated by reference.

FIELD OF THE INVENTION

The present invention relates generally to analog integrated circuits and specifically to methodologies for the reduction of power consumption in fully differential gain boosted operational amplifiers which result in enhancement of output swing characteristics, reduction of process dependency, lower power consumption and improvement in transient behavior.

BACKGROUND OF THE INVENTION

Analog circuits utilize operational amplifiers or op-amps as a core components for their functioning. The ideal characteristics of the operational amplifier include infinite gain and infinite bandwidth with very high input impedance and zero output impedance. Factors such as gain, bandwidth and power consumption of the op-amp are major factors responsible for limiting the accuracy inside analog circuits. There are many techniques proposed for achieving a high gain with wide bandwidth characteristics. Gain enhancement or gain boosting is one such known technique.

FIG. 1 illustrates a schematic of a conventional operational amplifier 100 with single ended gain boosting amplifiers. This scheme is proposed in "A fast-settling CMOS op amp for SC circuits with 90-db dc gain" by K. Bult and G. Geelen, IEEE Journal of Solid State Circuits, vol. 25, pp. 1379-1394, December 1990, the disclosure of which is hereby incorporated by reference. This technique has enabled circuit designers to exploit the advantages of single-stage amplifiers with an adequate gain. Single ended gain boosting amplifiers have great flexibility in biasing and maintaining the saturation margins of cascode as well as current mirrors but at the cost of extra power as compared to fully differential gain boosting amplifiers because four single ended boosters are required as compared to two in case of fully differential ones. Since one input terminal of the single ended gain boosting amplifiers is fixed, so the gain available is similar in both cases and fully differential boosters are inherently faster because of absence of mirror poles. Being faster inherently, this saves power as compared to single ended boosting amplifiers. But it is difficult to bias cascode transistors with fully differential gain boosters in a way to ensure their saturation margins with process variations.

Another conventional technique is presented in U.S. Pat. No. 5,748,040, the disclosure of which is incorporated by reference. This circuit proposes a technique to adapt to the process variations but it requires very high common mode bandwidth of the fully differential boosting amplifiers so that common mode signals cannot interfere with differential signals. This results in a greater more power requirement.

Another conventional technique is presented in U.S. Pat. No. 5,442,318, the disclosure of which is incorporated by reference. This reference explains that the common mode gain of boosting amplifiers should also be minimized in order to reduce noise sensitivity.

The conventional techniques utilize greater power consumption with poor transient behaviors. Moreover, the conventional techniques limit the output swing, which is also a critical requirement in the case of the low voltage applications.

Therefore, there is a need of a methodology for the reduction of power consumption in fully differential gain boosted operational amplifiers. Such a methodology could provide enhancement of output swing characteristics, reduction of process dependency, lower power consumption and improvements in transient operation.

SUMMARY

In an embodiment, a methodology is provided for minimizing power consumption in a fully differential gain boosted operational amplifiers.

In an embodiment, a methodology is provided that results in an enhancement of output swing characteristics.

In an embodiment, an adaptive bias module comprises: a bias generation module generating a first control signal, said first control signal being applied as an output common mode of a differential booster, and a bias replication module operatively coupled to the bias generation module for equalizing a common mode of the differential booster with the first control signal.

In an embodiment, a method for adaptive biasing in a differential gain boosted operational amplifier comprises: receiving a first bias voltage at an operational amplifier, generating a first control voltage at an output of said operational amplifier, applying the generated first control voltage to an output common mode input terminal of a differential booster for equalizing the first control voltage to the gate voltage of transistors, and adaptively equalizing source voltages of those transistors to the first bias voltage after equalizing the first control voltage VCMNB to the gate voltage of transistors.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF THE DRAWINGS

Figure 1:
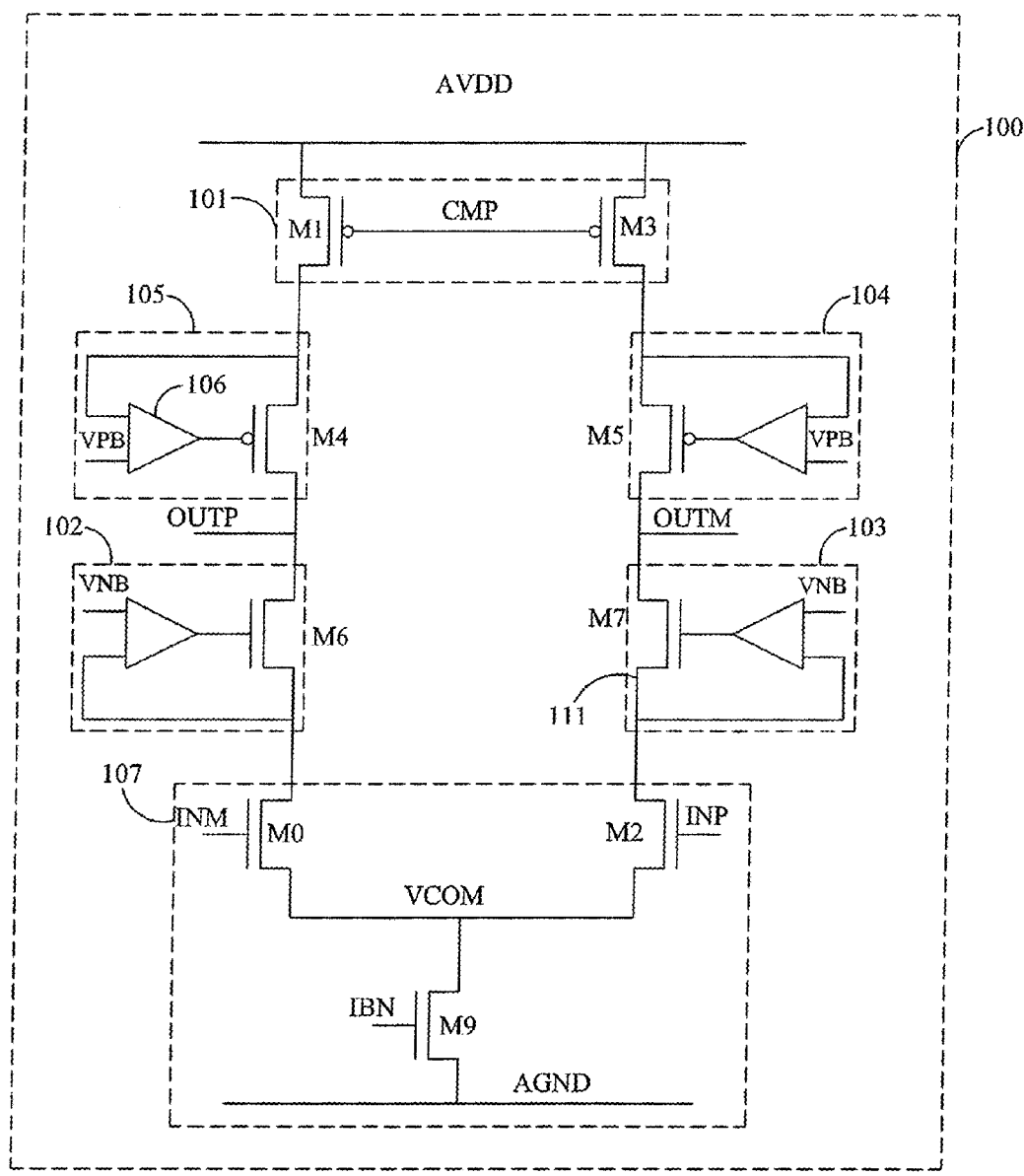
FIG. 1 illustrates a conventional operational amplifier with single ended gain boosting amplifiers.

The embodiments will be described in detail with reference to the accompanying drawings. However, the present invention is not limited to the embodiments which can be modified in various forms. The embodiments are only provided to explain more clearly the present invention to the one ordinarily skilled in the art. In the accompanying drawings, like reference numerals are used to indicate like components.

FIG. 1 illustrates a conventional operational amplifier with single ended gain boosting amplifiers and has already explained in the background section.

Figure 2:
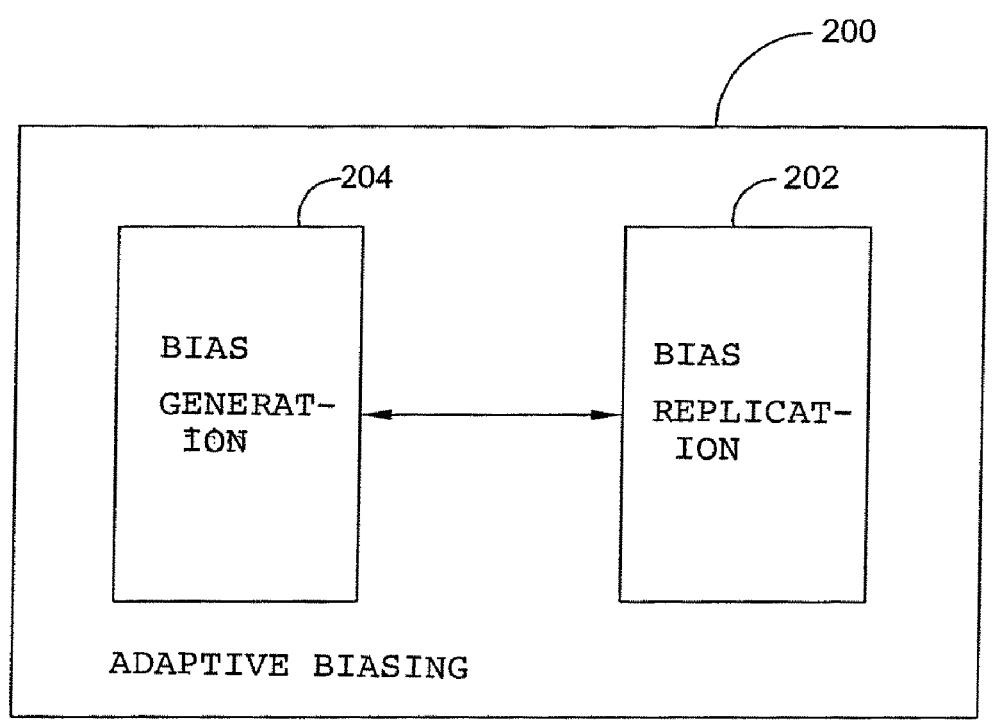
FIG. 2 illustrates a block diagram for adaptive biasing module according to an embodiment.

FIG. 2 illustrates a block diagram for an adaptive biasing module 200 according to an embodiment. The adaptive biasing module 200 includes a bias generation module 202 and a bias replication module 204. The bias generation module 202 generates a first control signal (VCMNB) and the first control signal is applied as an output common mode of a differential booster (inside the bias replication module 204 not shown in FIG. 2). The bias replication module 204 is coupled to the bias generation module 202 for equalizing a common mode of the differential booster with the first control signal (VCMNB).

Figure 3:
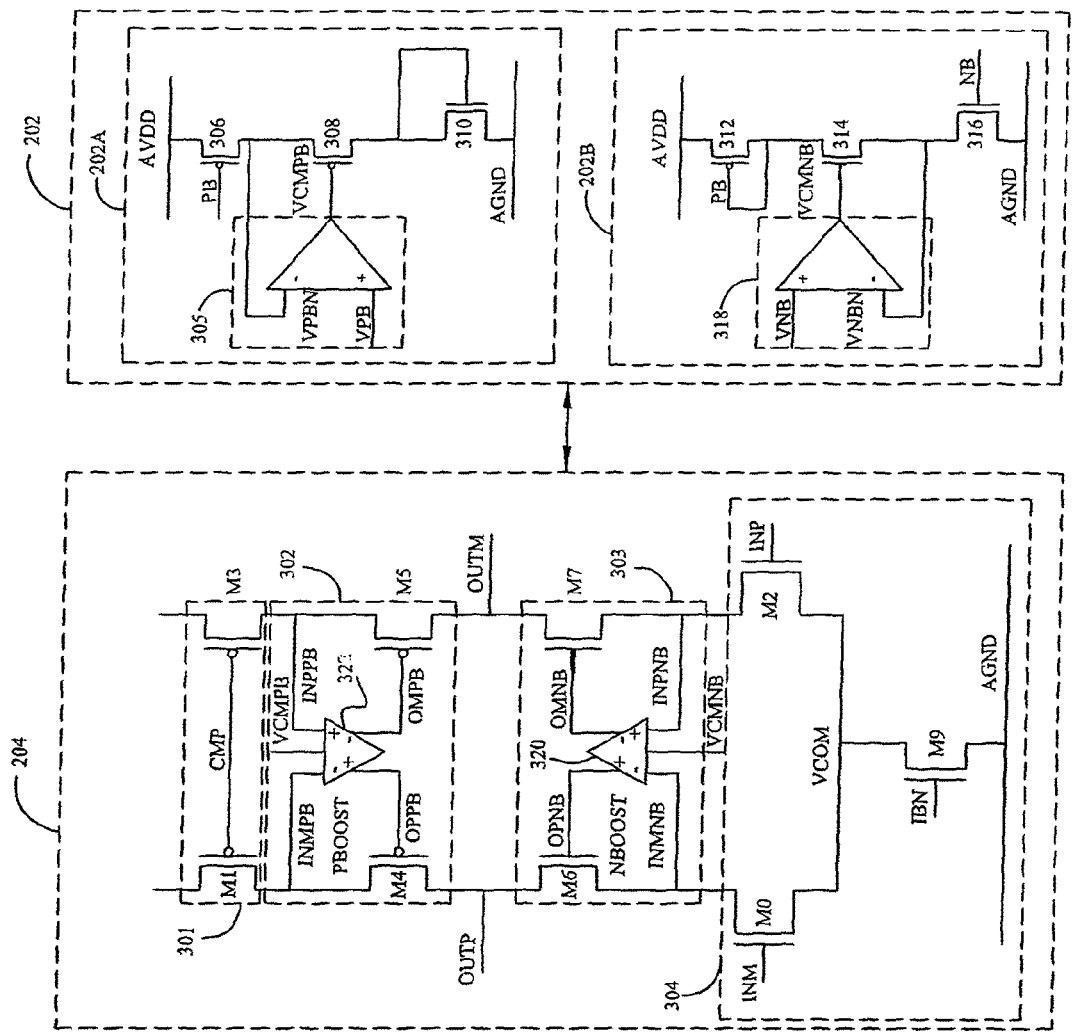
FIG. 3 illustrates an operational amplifier with fully differential gain boosting amplifiers according to another embodiment.

FIG. 3 illustrates an operational amplifier with fully differential gain boosting amplifiers according to another embodiment. Referring to the FIG. 3, a schematic block diagram of the folded cascode fully differential gain boosted operational amplifier is shown. The fully differential gain boosted operational amplifier includes the bias generation module 202 and the bias replication module 204. The bias generation module 202 can be realized by module 202A and 202B as shown. The realization of these modules is explained in the following sections.

The bias replication module 204 has a differential input pair and a differential output pair, differential input pair includes a positive input terminal INP and a negative input terminal INM at the gate terminals of the transistors M2 and M0 respectively. Input terminal INP and INM are coupled with the gates of input NMOS differential pair M2 and M0 with their source terminals coupled to a node VCOM which is coupled to a tail current source forming 304. Drain terminals of the NMOS differential pairs M2 and M0 are coupled to the positive and negative differential input terminals INMNB, INPNB of the fully differential amplifier NBOOST 320 with its differential output terminals OPNB, OMNB coupled to the gate terminals of cascode transistors M6, M7, respectively, and their source coupled with INMNB, INPNB, respectively. Drain terminals of M6, M7 are coupled to the differential output terminals OUTP, OUTM and drain terminals of PMOS transistors M4, M5. Gate terminals of PMOS transistors M4, M5 are coupled to the output terminals of the fully differential amplifier PBOOST 322 and source terminals are coupled with input differential terminals of PBOOST and to PMOS transistors M1, M3.

Voltage at node VCMPB, generated from circuit block 202A is the output terminal voltage of amplifier 305 whose non-inverting differential input terminal is coupled to a supply voltage VPB and whose inverting differential input terminal is coupled to drain terminal of PMOS 306 whose source terminal is coupled to a higher supply voltage and whose gate is coupled to a bias voltage PB. Output terminal VCMPB of amplifier 305 is coupled to the gate of PMOS 308 which has its drain coupled to the diode coupled NMOS 310 and its source coupled to a lower supply voltage AGND.

Node voltage at the node VCMNB is generated from circuit block 202B at the output terminal of amplifier 318 whose non-inverting differential input terminal is coupled to a supply voltage VNB and whose inverting terminal is coupled to a drain terminal of transistor 316 whose source terminal is coupled to lower supply voltage and whose gate terminal is coupled to a bias voltage NB. Output terminal VCMNB of amplifier 318 is coupled to the gate of NMOS 314 whose drain is coupled to the diode coupled PMOS transistor 312.

Overall the operational method of the foregoing circuitry helps in generating an adaptive voltage which can adapt to all process changes and produce a voltage applied as common mode input to fully differential booster amplifiers for maintaining a constant voltage at the source terminal of the cascode transistor whose gate is coupled to the corresponding output terminal of the fully differential booster.

Referring again to the modules 202A and 202B biasing currents across transistors 308 and 314 are maintained by biasing transistors 316 and 306 in such a way that biasing currents have following relation:

$$\frac{I_{M4,M5}}{I_{308}} = \frac{\frac{W_{M4,M5}}{L_{M4,M5}}}{\frac{W_{308}}{L_{308}}} \qquad \text{Equation 1}$$

$$\frac{I_{M6,M7}}{I_{314}} = \frac{\frac{W_{M6,M7}}{L_{M6,M7}}}{\frac{W_{314}}{L_{314}}} \qquad \text{Equation 2}$$

If biasing currents as defined by equation 1 and 2 are satisfied and transistors 314 and 308 are in saturation then the voltages generated as VCMPB and VCMNB will be such that the nodes INMNB, INPNB, INMPB and INPPB will have voltages equal to the voltages VNB and VPB respectively using first order approximation. Because VCMPB and VCMNB are generated in a way that inverting terminals of amplifiers 305 and 318 have values equal to VPBN and VNBN respectively, VCMNB and VCMPB are common mode voltages of amplifiers NBOOST 320 and PBOOST 322 respectively. Since this adaptive biasing circuitry 202A and 202B is not involved in the signal path of the main amplifier and differential boosters PBOOST 322 and NBOOST 320 it has no requirement of very high loop bandwidth of transistors 305 and 318. The differential gain of the transistors 305 and 318 can be taken appropriately as per common mode offset tolerance of PBOOST 322 and NBOOST 320.

Figure 4:
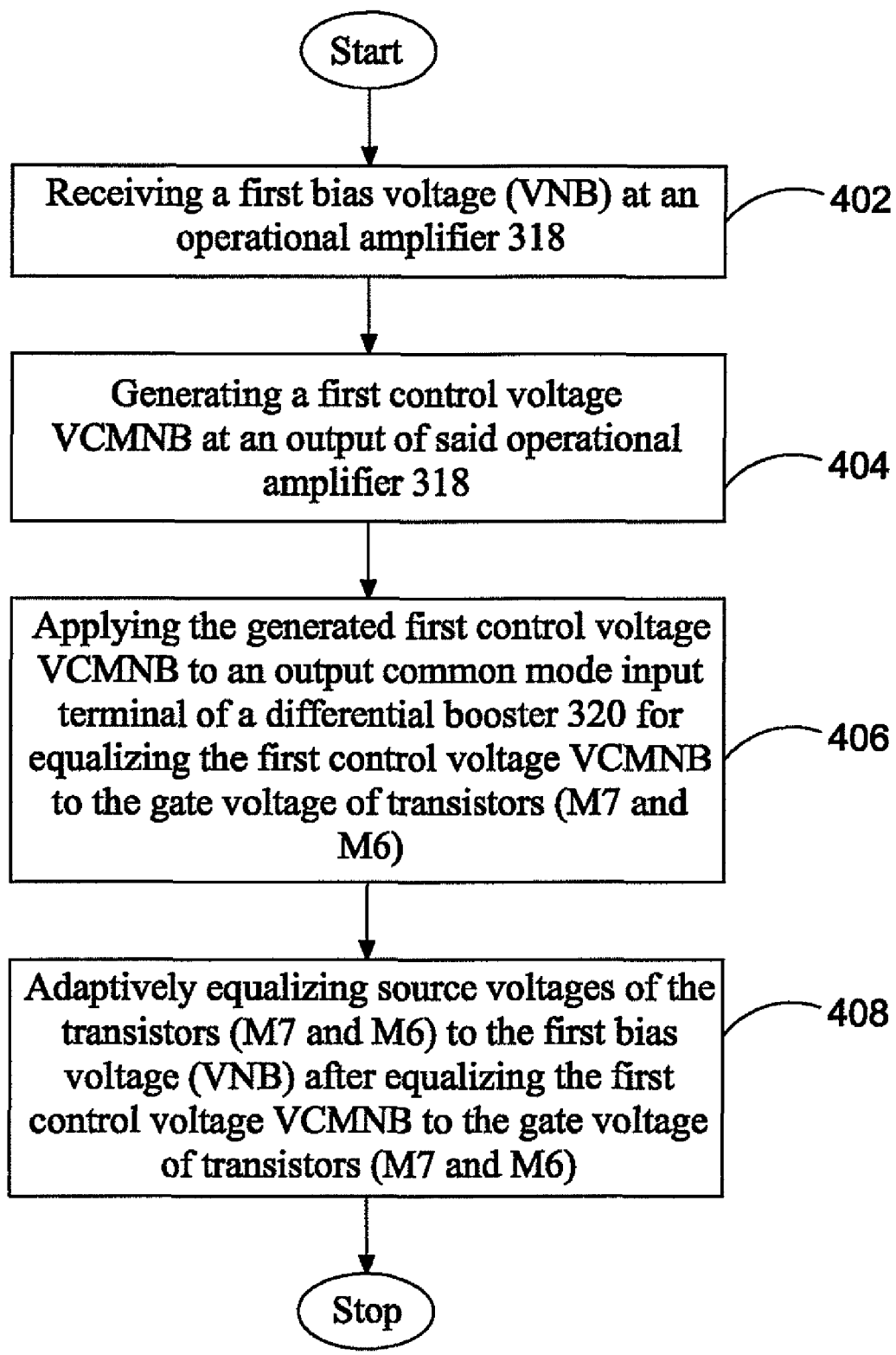
FIG. 4 illustrates a flow diagram of a method for adaptive biasing in a differential gain boosted operational amplifier.

FIG. 4 illustrates a flow diagram of a method for adaptive biasing in a differential gain boosted operational amplifier. At step 402, a first bias voltage (VNB) is received at an operational amplifier 318. At step 404, a first control voltage VCMNB is generated at an output of said operational amplifier 318. At step 406, the generated first control voltage VCMNB is applied to an output common mode input terminal of a differential booster 320 for equalizing the first control voltage VCMNB to the gate voltage of transistors (M7 and M6). At step 408, source voltages of the transistors (M7 and M6) are adaptively equalized to the first bias voltage (VNB) after equalizing the first control voltage VCMNB to the gate voltage of transistors (M7 and M6).

The embodiments disclosed offer several advantages, such as preserving advantages of high speed, reducing extra doublets utilizing techniques for reduction of power consumption in fully differential gain boosted operational amplifiers which results in enhancement of output swing characteristics, reducing process dependency, lower power consumption and improvements in transient behavior.

The embodiments can be used in various applications, such as presented invention is not limited to the telescopic main amplifier but it can be used with folded cascode and other differential main amplifier architectures implementing fully differential gain boosting amplifiers.

Although the disclosure of an adaptive bias module and method has been described in connection with the embodiment of the present invention illustrated in the accompanying drawings, it is not limited thereto. It will be apparent to those skilled in the art that various substitutions, modifications and changes may be made thereto without departing from the scope and spirit of the disclosure.

What is claimed:

1. An adaptive bias module comprising:
a bias generation module generating a first control signal from a first reference voltage, said first control signal having a regulated voltage applied to a common mode input of a differential booster having an output common mode; and
a bias replication module operatively coupled to the bias generation module and including the differential booster, the bias replication module including circuitry for equalizing the output common mode of the differential booster to the regulated voltage of the first control signal and equalizing differential input voltages of the differential booster to the first reference voltage.

2. The bias module of claim 1, wherein said bias replication module comprises:
a first pair of transistors having control terminals coupled to receive differential input signals; and
a second pair of transistors having control terminals coupled to receive differential outputs from the differential booster and first conduction terminals fed back to differential inputs of the differential booster and coupled to conduction terminals of the first pair of transistors, the second pair of transistors further having second conduction terminals coupled to differential output nodes.

3. The bias module of claim 2, wherein the differential booster is an operational amplifier.

4. The bias module of claim 2, wherein the first pair of transistors include second conduction terminals connected to a tail current source transistor.

5. An adaptive bias module, comprising:
a bias generation module generating a first control signal, said first control signal having a voltage applied to a common mode input of a differential booster having an output common mode; and
a bias replication module operatively coupled to the bias generation module and including the differential booster, the bias replication module including circuitry for equalizing the output common mode of the differential booster to the first control signal voltage;
wherein said bias generation module comprises:
an operational amplifier receiving a first signal and a second signal; and
a plurality of serially coupled transistors operatively coupled to said operational amplifier and including a first transistor whose control terminal is coupled to an output of the operational amplifier and having a conduction terminal outputting the first control signal.

6. The bias module of claim 5, wherein said bias generation module further comprises: a second transistor in series with the first transistor and having a control terminal receiving a bias voltage.

7. A method for adaptive biasing in a differential gain boosted operational amplifier comprising:
receiving a first bias voltage at an operational amplifier;
generating a first control voltage at an output of said operational amplifier;
applying the generated first control voltage to a common mode input terminal of a differential booster for equalizing the first control voltage to a gate voltage applied to each transistor in a pair of transistors; and
adaptively equalizing source voltages of the pair of transistors to the first bias voltage after equalizing the first control voltage to the gate voltage of the pair of transistors.

8. The method of claim 7, wherein generating the first control voltage comprises equalizing a source terminal of a transistor to the first bias voltage.

9. A circuit, comprising:
a bias voltage generation circuit generating a regulated bias voltage from a reference voltage;
a first pair of transistors having control terminals coupled to receive differential input signals;
a tail current source connected to first conduction terminals of the first pair of transistors;
a second pair of transistors having first conduction terminals coupled to differential output nodes and second conduction terminals of the second pair of transistors coupled to respective second conduction terminals of the first pair of transistors; and
an operational amplifier having a common mode input coupled to receive the regulated bias voltage and differential inputs coupled to respective second conduction terminals of the first and second pairs of transistors, the operational amplifier further including differential outputs coupled to respective control terminal inputs of the second pair of transistors.

10. The circuit of claim 9 wherein a common mode voltage at the second conduction terminals of the first and second pairs of transistors is substantially equal to the reference voltage.

11. A circuit, comprising:
a bias voltage generation circuit generating a regulated bias voltage from a reference voltage;
a first pair of transistors having control terminals coupled to each other and first conduction terminals;
a second pair of transistors having first conduction terminals coupled to differential output nodes and second conduction terminals of the second pair of transistors coupled to respective second conduction terminals of the first pair of transistors; and
an operational amplifier having a common mode input coupled to receive the regulated bias voltage and differential inputs coupled to respective second conduction terminals of the first and second pairs of transistors, the operational amplifier further including differential outputs coupled to respective control terminal inputs of the second pair of transistors.

12. The circuit of claim 11 wherein a common mode voltage at the second conduction terminals of the first and second pairs of transistors is substantially equal to the reference voltage.

13. A circuit, comprising:
a first bias voltage generation circuit generating a first regulated bias voltage from a first reference voltage;
a second bias voltage generation circuit generating a second regulated bias voltage from a second reference voltage;
a first pair of transistors having control terminals coupled to receive differential input signals;
a tail current source connected to first conduction terminals of the first pair of transistors;
a second pair of transistors having first conduction terminals coupled to differential output nodes and second conduction terminals of the second pair of transistors coupled to respective second conduction terminals of the first pair of transistors;
a first operational amplifier having a first common mode input coupled to receive the first regulated bias voltage and first differential inputs coupled to respective second conduction terminals of the first and second pairs of transistors, the first operational amplifier further including first differential outputs coupled to respective control terminal inputs of the second pair of transistors;

a third pair of transistors having first conduction terminals coupled to the differential output nodes and second conduction terminals; and a second operational amplifier having a second common mode input coupled to receive the second regulated bias voltage and second differential inputs coupled to respective second conduction terminals of the third pair of transistors, the second operational amplifier further including second differential outputs coupled to respective control terminal inputs of the third pair of transistors.

14. The circuit of claim 13 wherein:

a common mode voltage at the second conduction terminals of the first and second pairs of transistors is substantially equal to the first reference voltage; and a common mode voltage at the second conduction terminals of the third pair of transistors is substantially equal to the second reference voltage.

* * * * *